United States Patent
Li

(10) Patent No.: US 8,589,743 B2
(45) Date of Patent: Nov. 19, 2013

(54) DOUBLE DATA RATE SIGNAL TESTING ASSISTANT DEVICE

(75) Inventor: Jie Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/451,057

(22) Filed: Apr. 19, 2012

(65) Prior Publication Data

US 2013/0132785 A1    May 23, 2013

(51) Int. Cl.
*G11C 29/56* (2006.01)
*G11C 29/36* (2006.01)

(52) U.S. Cl.
USPC .................. 714/718; 714/724; 324/754.07

(58) Field of Classification Search
USPC .......... 714/718, 724, 736, 742, 735, 43, 712, 714/715; 324/751, 754, 765
See application file for complete search history.

(56) References Cited

U.S. PATENT DOCUMENTS

| | | | | |
|---|---|---|---|---|
| 4,223,968 A | * | 9/1980 | Kawabata et al. | 439/61 |
| 4,374,427 A | * | 2/1983 | Katayama | 708/650 |
| 5,857,866 A | * | 1/1999 | Felps | 439/289 |
| 5,864,455 A | * | 1/1999 | Gernhardt et al. | 361/42 |
| 6,287,129 B1 | * | 9/2001 | Kuo | 439/79 |
| 6,992,940 B1 | * | 1/2006 | Tauber | 365/202 |
| 7,766,672 B1 | * | 8/2010 | Chiang | 439/76.1 |
| 2005/0086409 A1 | * | 4/2005 | Grishaw et al. | 710/301 |
| 2008/0118681 A1 | * | 5/2008 | Ueno | 428/34.1 |
| 2010/0314761 A1 | * | 12/2010 | Yoshikawa et al. | 257/738 |

FOREIGN PATENT DOCUMENTS

| | | | | | |
|---|---|---|---|---|---|
| JP | 58129270 A | * | 8/1983 | | G01R 31/02 |
| JP | 10022024 A | * | 1/1998 | | H01R 33/76 |

* cited by examiner

*Primary Examiner* — Ajay Bhatia
*Assistant Examiner* — Dipakkumar Gandhi
(74) *Attorney, Agent, or Firm* — Altis & Wispro Law Group, Inc.

(57) ABSTRACT

A DDR signal testing assistant device includes a body. The body is detachably locked to a motherboard integrated with a DDR connector. The DDR connector defines a plurality of pins. The body defines a plurality of testing holes corresponding and mating with the pins. Each testing hole of the body is marked with characters. The characters indicate the denomination or property of each corresponding pin of the DDR connector.

20 Claims, 3 Drawing Sheets

DOUBLE DATA RATE SIGNAL TESTING ASSISTANT DEVICE

BACKGROUND

1. Technical Field

The present disclosure relates to a double data rate (DDR) signal testing assistant device for electronic devices.

2. Description of Related Art

Double data rate SDRAM (DDR SDRAM) is synchronous dynamic RAM (SDRAM) that can theoretically improve memory clock speed to at least 200 MHz for electronic devices (such as computers and servers). When a motherboard of the electronic device is manufactured, it is necessary to test the DDR signal. Such a test is now commonly implemented by an operator first finding the test points (such as signal pins of a DDR connector) one by one and then testing the signal. However, since the DDR connector defines a number of pins (for example, 240 pins on a DDR 3), the test is complicated and laborious.

Therefore, there is room for improvement within the art.

BRIEF DESCRIPTION OF THE FIGURES

Many aspects of the disclosure can be better understood with reference to the following figures. The components in the figures are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
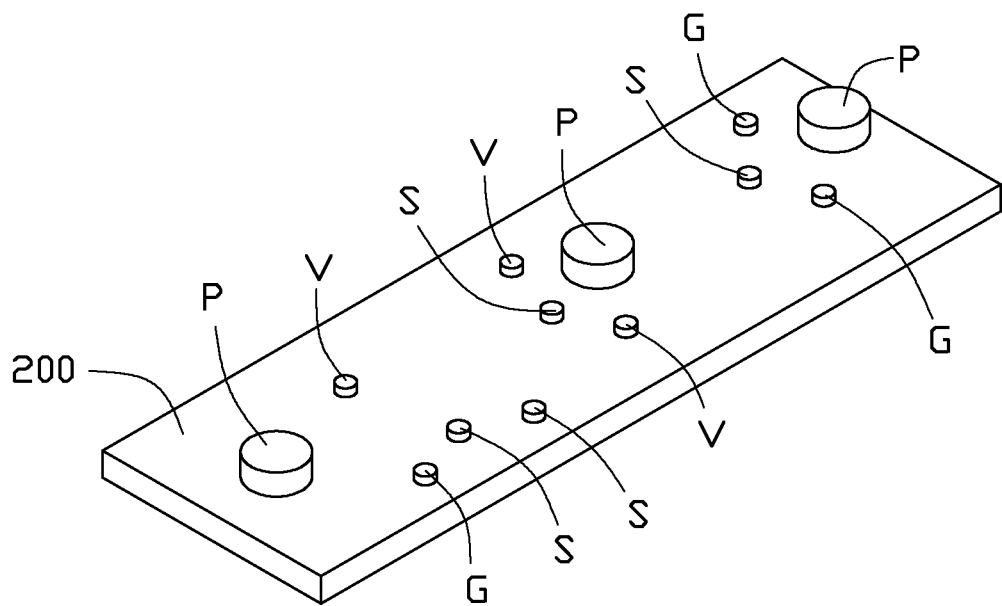
FIG. 1 is a schematic view of a motherboard integrated with a DDR connector.
Figure 2:
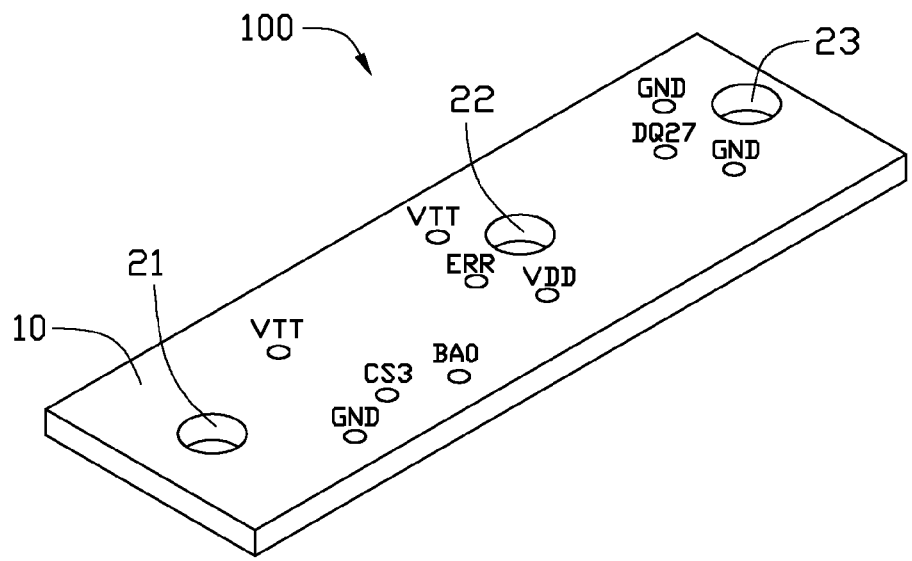
FIG. 2 is a schematic view of an exemplary embodiment of a DDR signal testing assistant device.

FIGS. 1 and 2, show in one exemplary embodiment, a DDR signal testing assistant device 100 used for assisting the testing of the DDR signal of a motherboard 200 of an electronic device (such as a computer or a server, not shown) is provided.

Figure 3:
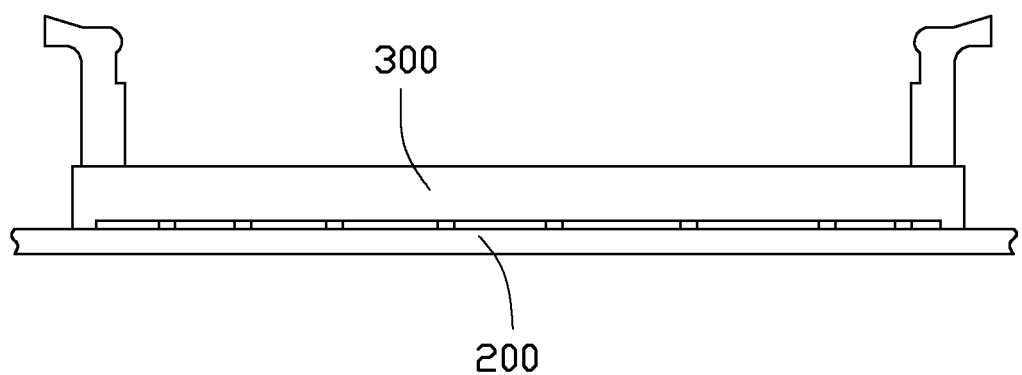
FIG. 3 is a schematic view of a DDR connector integrating with the motherboard shown in FIG. 1.

FIG. 3 shows the motherboard 200 integrated with at least a DDR connector 300. In the exemplary embodiment, the DDR connector 300 has 240 pins, only a portion of which are shown for clarity. The pins are all exposed on a surface of the motherboard 200. The pins may include a plurality of power source pins V, a plurality of grounding pins G, and a plurality of signal pins S. The motherboard 200 also defines three locating points P. The locating points P may be screws/dowels which secure the DDR connector 300 to the motherboard 200.

The DDR signal testing assistant device 100 includes a body 10. The body 10 may be made of plastic, such as, acrylonitrile butadiene styrene. The body 10 can be detachably locked to the motherboard 200. The body 10 defines a plurality of testing holes corresponding to the pins of the motherboard 200. The body 10 also defines three locating holes corresponding to the locating points P of the motherboard 200. In the exemplary embodiment, the quantity of the testing holes is 240, for example. The locating holes are respectively marked by reference numerals of 21, 22, and 23.

Each testing hole of the body 10 mates with a corresponding pin of the DDR connector 300, allowing pins to pass through the body 10 by the testing holes. The testing holes may be classified into three types as described below, and are marked by adjacent characters. The testing holes belonging to different types are indicated by characters of different colors.

One type of the testing holes are signal holes. The signal holes mate with the signal pins of the DDR connector 300. The body 10 also defines a plurality of characters marked adjacent to each signal hole, such as CS3, BA0, ERR, and DQ27. The characters indicate the denominations (or properties) of the corresponding signal pins. For identification, the characters may be printed on the body 10 using black ink.

The second type of the testing holes are grounding holes. The grounding holes mate with the grounding pins of the DDR connector 300. The body 10 also defines a plurality of characters marked adjacent to each grounding hole, such as GND. The character indicates that the pins mating to the grounding holes are grounding pins. For identification, the characters may be printed on the body 10 using blue ink.

The third type of the testing holes are power source holes. The power source holes mate with the power source pins of the DDR connector 300. The body 10 also defines a plurality of characters marked adjacent to each power source hole, such as VTT, and VDD. The characters indicate that the pins mating to the power source holes are power source pins. The VTT indicates the power source pins output a voltage of about 1.5 V. The VDD indicates the power source pins output a voltage of about 0.75 V. For identification, the characters may be printed on the body 10 using red ink.

The locating holes 21-23 are respectively mated with a locating point P of the motherboard 200, allowing the locating points P to pass through the body 10 from the locating holes 21-23 and locking the body 10 to the motherboard 200.

When using the DDR signal testing assistant device 100, the body 10 is first locked to the motherboard 200 by mating the locating holes 21-23 with the locating points P. The signal pins of the DDR connector 300 pass through the signal holes of the body 10 and are exposed to the body 10. The grounding pins of the DDR connector 300 pass through the grounding holes of the body 10 and are exposed to the body 10. The power source pins of the DDR connector 300 pass through the power source holes of the body 10 and are exposed to the body 10. When any one of the signal pins of the DDR connector 300 needs to be tested, one operator can quickly find the signal pin by looking for the characters printed on the body 10. For example, a BANK signal pin of the DDR connector 300 can be quickly found by looking for the character of BA0 on the body 10. Then the operator can use a probe to contact the BANK signal pin, and use another probe to contact the nearest grounding pin to the BANK signal pin to test the DDR signal.

In the exemplary embodiment, by using the DDR signal testing assistant device 100, the grounding pins can also be quickly found by looking for the characters of the grounding holes of the body 10, thus testing time is saved. Furthermore, by using the DDR signal testing assistant device 100, the nearest grounding pins to the signal pins can be accurately found, which prevents an incorrect test and a distorted signal.

The DDR signal testing assistant device 100 can also assist to quickly test the power source stability of the motherboard 200 as well as the DDR signal test.

The number of the test holes of the DDR signal testing assistant device 100 are not restricted by 240.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:

1. A DDR signal testing assistant device, comprising:
a body;
wherein the body is detachably locked to a motherboard integrated with a DDR connector, the DDR connector defines a plurality of pins, the body defines a plurality of testing holes corresponding and mating with the pins, each testing hole of the body is marked with characters printed on the body, the characters indicate the denomination or property of each corresponding pin of the DDR connector; the testing holes are classified into different types, and the testing holes belonging to different types are indicated by characters of different colors.

2. The device as claimed in claim 1, wherein the motherboard defines three locating points, the body defines three locating holes corresponding to the locating points, the locating points pass through the locating holes.

3. The device as claimed in claim 1, wherein the testing holes comprise a plurality of signal holes, the DDR connector defines a plurality of signal pins, each signal hole mates with each signal pin.

4. The device as claimed in claim 3, wherein the signal holes are marked with CS3, BA0, ERR, or DQ27.

5. The device as claimed in claim 1, wherein the testing holes comprise a plurality of grounding holes, the DDR connector defines a plurality of grounding pins, each grounding hole mates with each grounding pin.

6. The device as claimed in claim 5, wherein the grounding holes are marked with characters of GND.

7. The device as claimed in claim 1, wherein the testing holes comprise a plurality of power source holes, the DDR connector defines a plurality of power source pins, each power source hole mates with each power source pin.

8. The device as claimed in claim 7, wherein the power source holes are marked with VTT or VDD.

9. The device as claimed in claim 1, wherein the body is made of plastic.

10. The device as claimed in claim 9, wherein the plastic is acrylonitrile butadiene styrene.

11. The device as claimed in claim 1, wherein the characters are printed ink characters.

12. A DDR signal testing assistant device, comprising:
a body, the body being detachably locked to a motherboard integrated with a DDR connector, the body being defined a plurality of testing holes corresponding and mating with pins of the DDR connector, each testing hole of the body being marked with characters printed on the body for indicating the denomination or property of each corresponding pin; the testing holes are classified into different types, and the testing holes belonging to different types are indicated by characters of different colors.

13. The device as claimed in claim 12, wherein the motherboard defines a plurality of locating points, the body defines a plurality of locating holes corresponding and mating with the locating points, the locating points pass through the locating holes.

14. The device as claimed in claim 12, wherein the testing holes comprise a plurality of signal holes which mates with signal pins of the DDR connector.

15. The device as claimed in claim 14, wherein the signal holes are marked with CS3, BA0, ERR, or DQ27.

16. The device as claimed in claim 12, wherein the testing holes comprise a plurality of grounding holes which mates with grounding pins of the DDR connector.

17. The device as claimed in claim 16, wherein the grounding holes are marked with characters of GND.

18. The device as claimed in claim 12, wherein the testing holes comprise a plurality of power source holes which mates with power source pins of the DDR connector.

19. The device as claimed in claim 18, wherein the power source holes are marked with VTT or VDD.

20. A DDR signal testing assistant device detachably locked to a motherboard integrated with a DDR connector, comprising:
a body, the body being defined a plurality of testing holes corresponding and mating with pins of the DDR connector, each testing hole of the body being marked with characters printed on the body for indicating the denomination or property of each corresponding pin; the testing holes are classified into different types, and the testing holes belonging to different types are indicated by characters of different colors.

* * * * *